United States Patent [19]
Kulik et al.

[11] Patent Number: 5,717,478
[45] Date of Patent: Feb. 10, 1998

[54] PHOTOVOLTAIC MODULE WITH LIQUID CRYSTAL DISPLAY INDICATOR

[75] Inventors: David Kulik, Hurley; Martin Charles, Ellenville; Morton Schiff, Olive Bridge; John Calhoun, Ellenville, all of N.Y.

[73] Assignee: Besicorp Group Inc., Kingston, N.Y.

[21] Appl. No.: 660,493

[22] Filed: Jun. 7, 1996

[51] Int. Cl.$^6$ .................. G02F 1/133; G02F 1/13
[52] U.S. Cl. .................. 349/199; 349/34; 349/20; 356/218
[58] Field of Search .................. 349/199, 20, 34; 356/218; 340/715; 250/203; 323/268

[56] References Cited

U.S. PATENT DOCUMENTS

| | | | |
|---|---|---|---|
| 4,328,490 | 5/1982 | Usuba et al. | 340/715 |
| 4,551,669 | 11/1985 | Itoh et al. | 323/268 |
| 4,868,379 | 9/1989 | West | 250/203 |
| 5,066,104 | 11/1991 | Mohebban et al. | 359/43 |
| 5,153,760 | 10/1992 | Ahmed | 359/70 |
| 5,590,495 | 1/1997 | Bressler et al. | 52/173.3 |

*Primary Examiner*—William L. Sikes
*Assistant Examiner*—Julie Ngo
*Attorney, Agent, or Firm*—Charles J. Brown

[57] ABSTRACT

A photovoltaic module capable of being oriented by hand with respect to the sun including an electrically activated liquid crystal display device for generating a visual informational display which indicates at least the power generating effectiveness of the module for its instantaneous orientation with respect to the sun, and an array of photovoltaic cells for generating a first power output for a load and a second power output for activating the liquid crystal display device and a third power output signal for the liquid crystal display device indicating the power generating effectiveness of the module.

6 Claims, 3 Drawing Sheets

PHOTOVOLTAIC MODULE WITH LIQUID CRYSTAL DISPLAY INDICATOR

BACKGROUND OF THE INVENTION

Power generating photovoltaic modules are often used with portable electrical equipment. For example, it has been proposed to mount such modules on the exterior of a case containing batteries and an electrically activated device such as a lap top computer. The case itself is oriented by hand with respect to an energizing light source, usually the sun, so that the module can generate electricity to charge the batteries from which the computer is powered.

There is always an optimum orientation of the module with respect to the light source which yields the maximum power output from the module. That optimum orientation is usually when the incident light falls generally perpendicular to the photovoltaic cells of the module, though that may vary depending upon the effect of random reflected light supplementing the direct sunlight.

U.S. Pat. No. 4,551,669 describes photovoltaic modules mounted on a mobile object such as an automobile which as it changes location experiences variations in energizing light and power output. A regulating system is provided which is powered from the cells of the module and which automatically switches the cells between series and parallel connections in response to a signal from a light intensity detector. In doing so the power output of the cells at a given instantaneous position of the automobile on which the module is mounted can be increased depending upon whether a series or a parallel configuration yields a greater output.

In contrast the principal object of the present invention is to provide power output maximization for a photovoltaic module on a portable object which is oriented by hand with respect to an energizing light source. This is achieved by a visual informational display on the module itself which informs the operator exactly what position of the module is the optimum for yielding the greatest power output. U.S. Pat. No. 4,868,379 describes an automatic motorized tilting system whereby a module hunts for and fixes on a maximum power output orientation, but that would be of no use for a photovoltaic module mounted on a portable object and positioned by hand during operation.

SUMMARY OF THE INVENTION

A photovoltaic module is provided by the invention for generating electrical power and which is capable of being oriented by hand with respect to an energizing light source. The module includes a substantially planar body. Located on the module body is an electrically activated liquid crystal display device for creating a visual informational display which indicates at least the power generating effectiveness of the module for its instantaneous orientation with respect to the energizing light source. Also located on the module body is an array of photovoltaic cells for generating a relatively high power output for a load and a relatively low power output for activating the liquid crystal display device and also for generating a power output signal for the liquid crystal display device which indicates the power generating effectiveness of the module.

In a preferred form of the invention, primary cells generate the power output for the load and for activating the liquid crystal display device and at least one secondary cell generates the power output signal. The liquid display device may also create a visual informational display which indicates the direction of any change in the power output signal.

The secondary photovoltaic cell may be a dedicated cell for the power output signal alone. In one embodiment of the invention the module may be mounted exteriorly on a case adapted to contain a load-creating device.

DESCRIPTION OF PREFERRED EMBODIMENT

Figure 1:
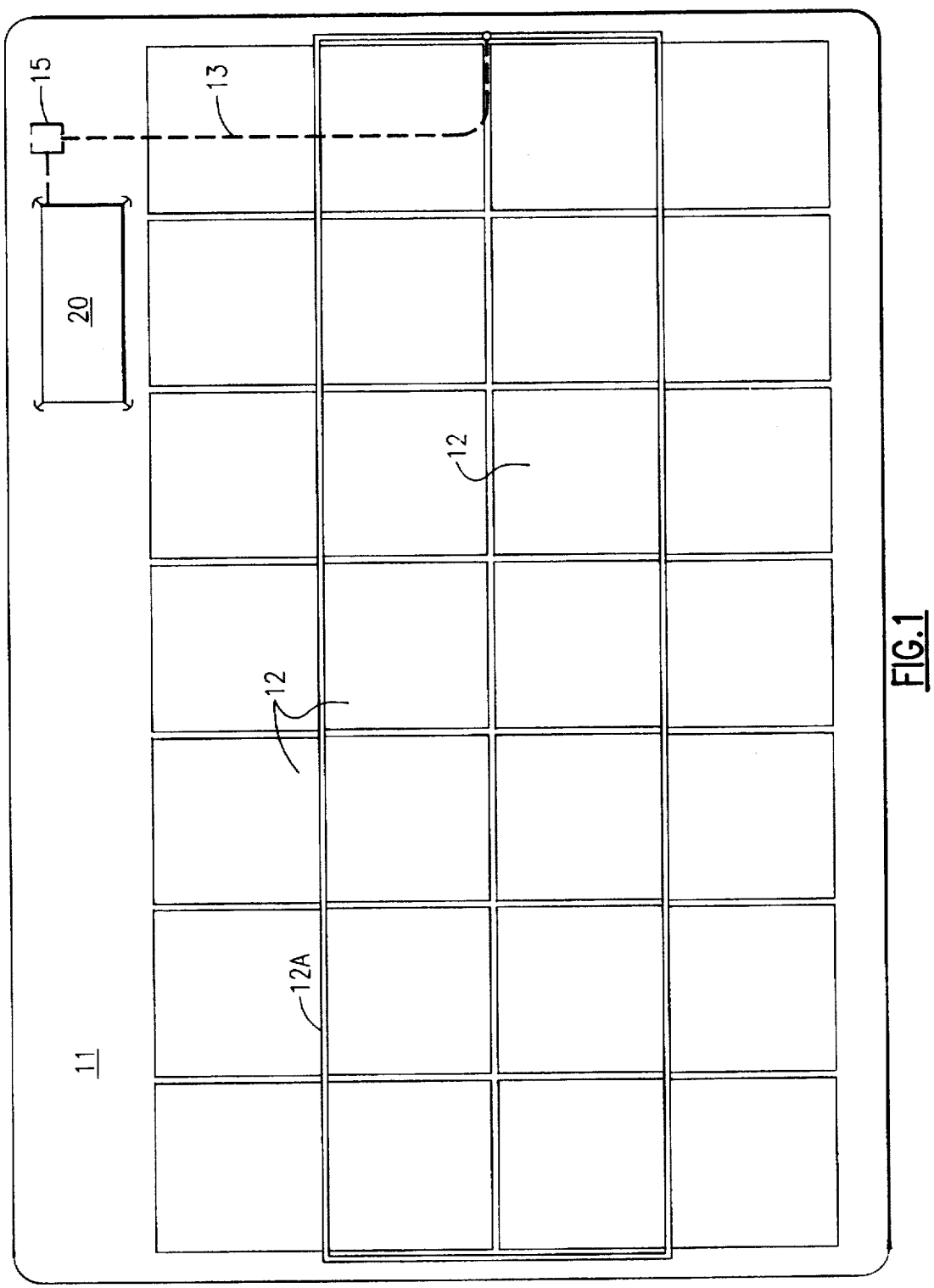
FIG. 1 is a plan view of a photovoltaic module according to the invention.

Referring first to FIG. 1, a photovoltaic module generally indicated as 10 includes a planar body 11 on which is mounted an array of primary photovoltaic cells 12 for generating relatively high power output for a load.

In this example of the module 10, the body 11 is a sheet of black acrylonitrile butyl styrene (ABS) of rectangular shape, perhaps about 10"×15". There are fourteen cells 12 shown mounted on the body 11 in this embodiment, all interconnected in a conventional manner by appropriate bus bar conductors 12A. The power output of the cells 12 of the module 10 is carried by a conductor 13 to a connector 15.

Figure 2:
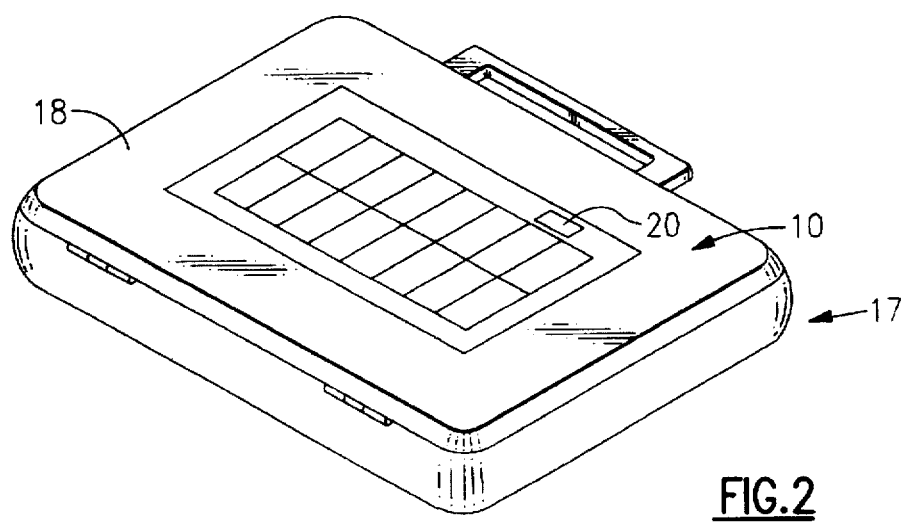
FIG. 2 is an illustration of the module of the invention in combination with a case adapted to contain a load-creating device such as a computer.

As shown in FIG. 2, the module 10 may be mounted, for example, on a case 17 and fixed to one exterior surface of the case such as its lid 18, and the load could be batteries and a lap top computer contained within the case. That load may be connected to the module 10 at the connector 15.

Figure 3:
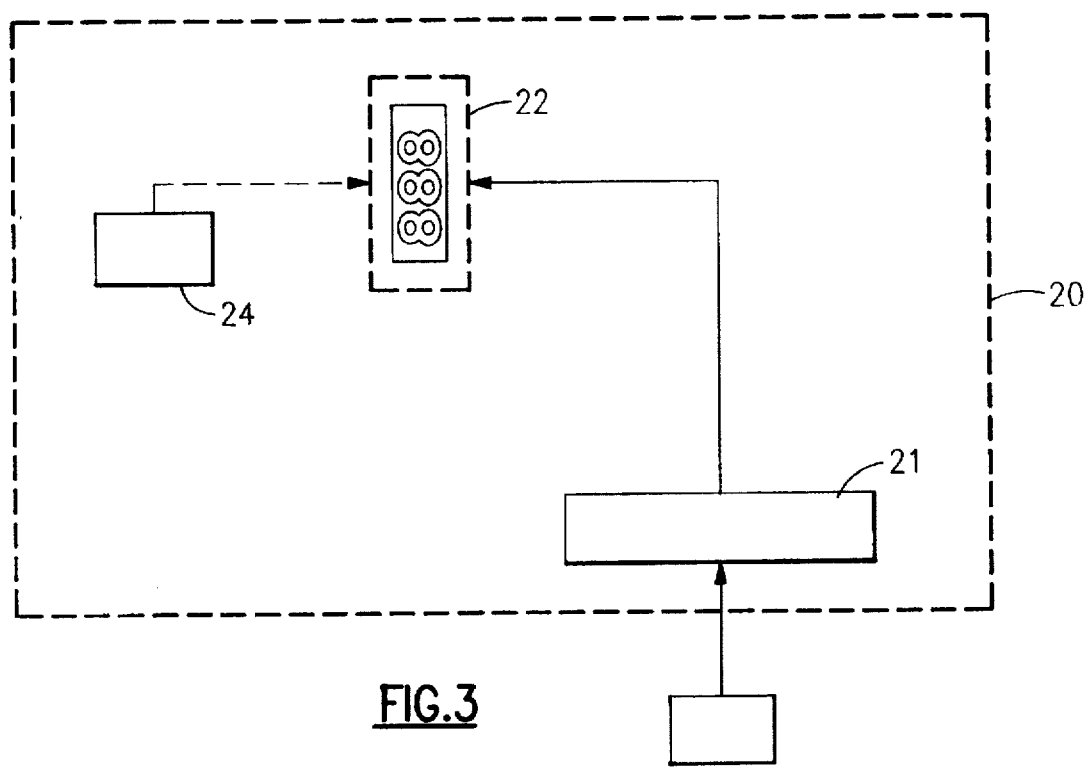
FIG. 3 is a diagrammatic illustration of the components of the liquid crystal display device included in the module.

Referring now to FIG. 3 the module 10 supplies a relatively low power output to a display assembly generally indicated within dotted lines 13. The display assembly 20 also appears in FIG. 1 in an appropriate aperture in the module body 11. The assembly 20 includes a linear voltage regulator 21 and a liquid crystal display device 22. In addition the assembly 20 includes its own small secondary photovoltaic cell or sun sensor 24. As described hereinafter the sun sensor 24 is preferably a dedicated cell serving only to signal the liquid crystal display device 22 as to the power output effectiveness of the module 10 for its instantaneous orientation with respect to the energizing light source such as the sun.

Figure 4:
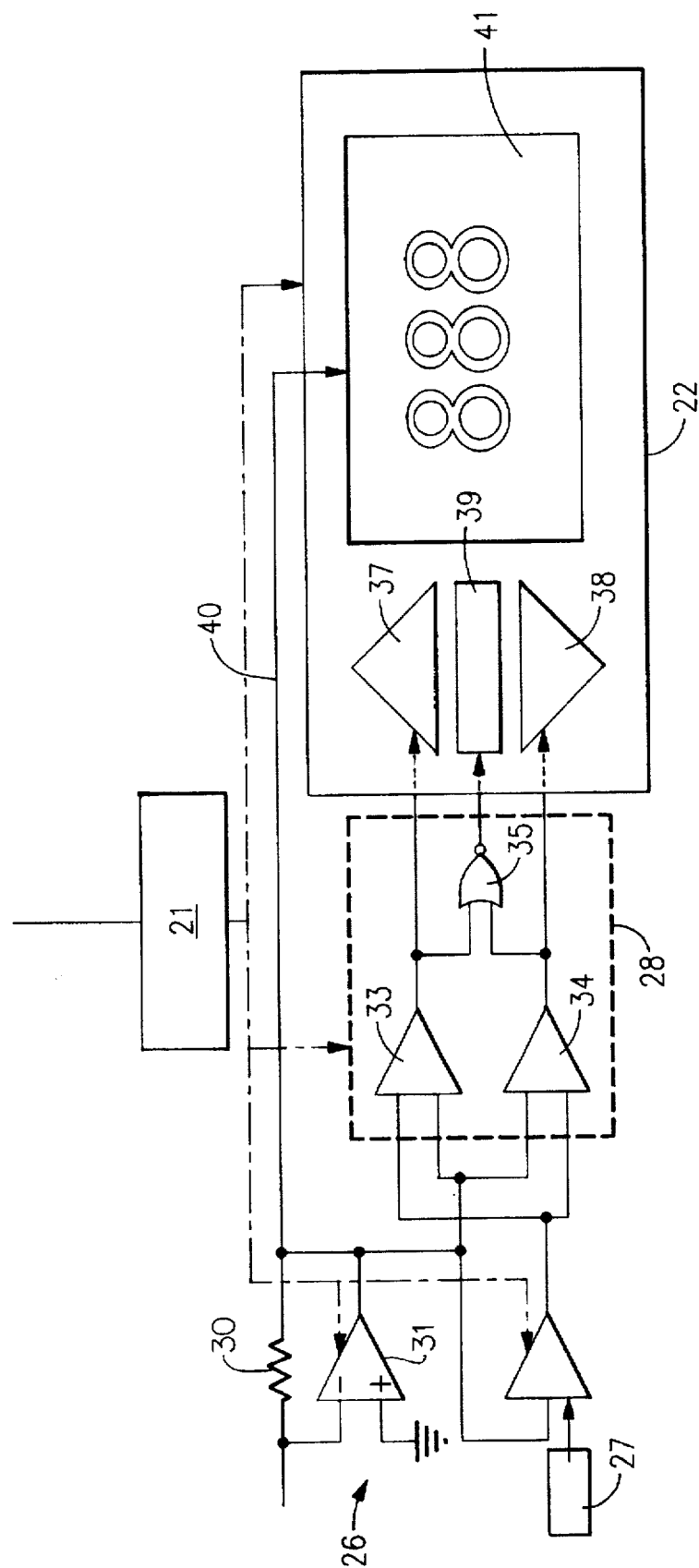
FIG. 4 is a circuit diagram of the liquid crystal display device and those components directly associated therewith.

Referring now to FIG. 4, the electrical power output from the module 10 is transmitted to the linear voltage regulator 21 which supplies a substantially constant volt direct-current output of approximately 5 or 6 volts. As shown by the dot-dash lines, this voltage output is delivered to a conventional sample and hold circuit 26 associated with a timer 27, to a window comparator 28 and to the liquid crystal display device 22. Relatively low power output from the sun sensor 24 is delivered to the sample and hold circuit 26 where a resistor 30 and an operating amplifier 31 convert current output to a voltage signal. The timer 27 may be selectively adjusted to determine the frequency and duration of the voltage signal from the sample and hold circuit 26 to be delivered to the window comparator 28. The window comparator 28 includes individual comparators 33 and 34 and a logical nor 35 functioning in a known manner to indicate the direction of change of the voltage signal from the sample and hold circuit 26. If the change of that signal is increasing, a positive direction of change arrow 37 on the display device 22 becomes visible. If the change of that signal is decreasing a negative direction of change arrow 38 on the display device 22 becomes visible. If the signal is constant and not changing then a center bar 39 on the display 22 becomes visible. The voltage signal from the sample and hold circuit 26 is also transmitted by a conductor 40 to a digital informational display 41 where its level of intensity is indicated by digits ranging, for example, from 000 to 999. This quantifies the power output effectiveness of the module 10 for its instantaneous orientation with respect to the source of sunlight.

In operation the module 10 is oriented by hand with respect to an energizing light source such as the sun. If the incidence of energizing light, or insolation, falls generally perpendicular to the module 10, the sun sensor 24 will produce a maximum signal for that intensity of sunlight and a corresponding reading will be visible on the digital display 41. If the module is oriented by hand to a position where the incident sunlight is not falling generally perpendicularly upon it, the signal from the sun sensor 24 will be reduced and a lesser number will appear in the digital display 41. In moving from the maximum to the lesser output the negative direction of change arrow 38 will be visible. As the operator moves the module 10 back toward the orientation of maximum power output, the numbers visible in the digital display 41 will increase and the positive change arrow 37 will be visible. With the module 10 held stationary the center bar 29 of the display 39 will be visible.

By taking into account this read-out information the operator will be able to locate the optimum position of the module 10 with respect to the energizing sunlight. As the intensity of the sunlight itself increases or decreases while the module 10 remains stationary, the read-out information on the arrows 37 and 38 and on display 41 will vary accordingly. This can be useful to the operator to know how the power output effectiveness of the module 10 is varying by the climatic changes or motion of the sun through the sky affecting the intensity of the sunlight.

The scope of the invention is to be determined from the following claims rather than from the foregoing description of a preferred embodiment.

We claim:

1. A photovoltaic module for generating electrical power and capable of being oriented by hand with respect to an energizing light source comprising
   a. a substantially planar module body,
   b. an electrically activated liquid crystal display device on the module body for generating a visual informational display which indicates at least the power generating effectiveness of the module for its instantaneous orientation with respect to the energizing light source,
   c. an array of photovoltaic cells on the module body for generating a relatively high power output for a load and a relatively low power output for activating the liquid crystal display device and also for generating a power output signal for the liquid crystal display device indicating said power generating effectiveness of the module.

2. A photovoltaic module according to claim 1 wherein the liquid crystal display device also creates a visual informational display which indicates the direction of any change in the power output signal from the secondary photovoltaic cell.

3. A photovoltaic module according to claim 1 wherein the secondary photovoltaic cell is a dedicated cell for the power output signal alone.

4. A photovoltaic module according to claim 1 in combination with and mounted exteriorly on a case adapted to contain a load-creating device.

5. A photovoltaic module for generating electrical power and capable of being oriented by hand with respect to an energizing light source comprising
   a. a substantially planar module body,
   b. an electrically activated liquid crystal display device on the module body for generating a visual informational display which indicates at least the power generating effectiveness of the module for its instantaneous orientation with respect to the energizing light source,
   c. an array of primary photovoltaic cells on the module body for generating a relatively high power output for a load and a relatively low power output for activating the liquid crystal display device, and
   d. at least one secondary photovoltaic cell on the module body for generating a power output signal for the liquid crystal display device indicating said power generating effectiveness of the module.

6. A photovoltaic module for generating electrical power and capable of being oriented by hand with respect to an energizing light source comprising
   e. a substantially planar module body,
   f. an electrically activated liquid crystal display device on the module body for generating a visual informational display which indicates the power generating effectiveness of the module for its instantaneous orientation with respect to the energizing light source and also the direction of any change in that effectiveness,
   g. an array of primary photovoltaic cells on the module body for generating a relatively high power output for a load and a relatively low power output for activating the liquid crystal display device,
   h. a secondary photovoltaic cell on the module body for generating a power output signal for the liquid crystal display device indicating said power generating effectiveness of the module and the direction of any change in said effectiveness,
   i. said secondary photovoltaic cell being a dedicated cell for the power output signal only, and
   j. a case upon which the module body is exteriorly mounted adapted to contain a load-creating device.

* * * * *